Feb. 20, 1951 A. KÄCH ET AL 2,542,416

SHORT WAVE TUNING SYSTEM

Filed May 22, 1945

Inventor:

Alfred Käch,

Alfred de Quervain,

By Pierce & Scheffler,

Attorneys.

Patented Feb. 20, 1951

2,542,416

UNITED STATES PATENT OFFICE 2,542,416

SHORT WAVE TUNING SYSTEM

Alfred Käch, Baden, and Alfred de Quervain, Zurich, Switzerland, assignors to Patelhold Patentverwertungs- & Elektro-Holding A.-G., Glarus, Switzerland Application May 22, 1945, Serial No. 595,238
In Switzerland May 12, 1944

Section 1, Public Law 690, August 8, 1946
Patent expires May 12, 1964

6 Claims. (Cl. 250—40)

Known tuning systems for very short waves consist normally of variable inductances which are connected to fixed capacitances. Such tuning systems possess the disadvantage that their resonance resistance depends on the prevailing adjustment of the capacitance and inductance, so that optimum conditions are not obtained over the whole range of adjustment. Furthermore such tuning systems possess a relatively narrow frequency adjusting range (about 1:2.5).

These disadvantages are avoided according to the present invention by means of a tuning system of which the tuning coil and fixed plates of the tuning condenser are arranged along at least one axis parallel to an axis of rotation, disc members being located on this axis of rotation which can be inserted between the coil turns and the fixed condenser plates for simultaneously altering the capacity and inductance in the same sense.

The frequency adjusting range of a tuning system constructed according to the invention amounts to about 1:8.

By altering the capacitance C and the inductance L simultaneously in the same sense it is possible with the tuning system according to the invention to maintain the ratio $$\frac{L}{C}$$

approximately constant over the desired adjustment range by means of a suitable choice of dimensions for the individual parts of the tuning condenser and the tuning coil. The resonance resistance R of the tuning system is thus approximately constant over this range of adjustment, because the relationship $$R=\frac{L}{W+C}$$

applies to the former, where W is the loss resistance of the coil.

A number of constructional examples of the invention are illustrated in the accompanying drawings.

Figure 1:
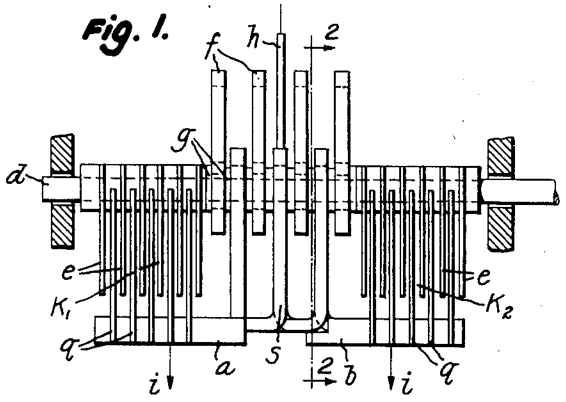
Fig. 1 is a side elevation of a practical construction of a symmetrical tuning system for push-pull oscillation generation embodying the principles of the invention.
Figure 2:
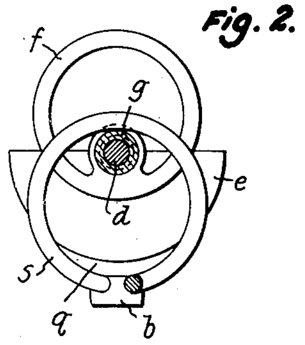
Fig. 2 is a vertical section taken on line 2—2 of Fig. 1.

With the construction shown in Figs. 1, 2 the tuning condenser is divided into two halves $K_1$, $K_2$ which are arranged one at each side of the tuning coil S. Parallel to the axis of rotation (shaft *d*) are two conductive rods *a*, *b* on which the fixed plates *q* of both condenser halves are mounted. The ends of the tuning coil S are fixed to the free ends of rods *a* and *b*. The movable plates *e* of the condenser halves $K_1$, $K_2$ as well as several disc members *f* for altering the inductance of coil S are located along the axis of and turned by shaft *d*. Shaft *d* is made from conductive material so that the movable plates *e* of both condenser halves $K_1$, $K_2$ are connected together electrically. In the illustrated embodiment, disc members *f* are annular and are mounted on intermediate bushings *g* of insulating material that are carried by shaft *d* so as to be insulated from each other. The disc members *f* rotate with shaft *d* and are made of electrically conductive material which causes the flux of tuning coil S to vary as the disc members move into and out of position between adjacent turns of the coil.

Figure 3:
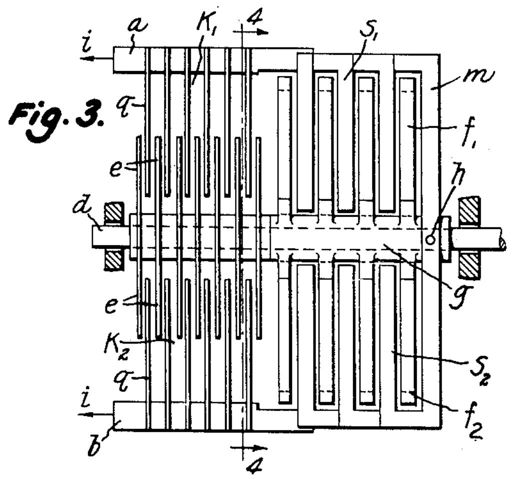
Fig. 3 is a side elevation of a modified construction of a symmetrical tuning system.
Figure 4:
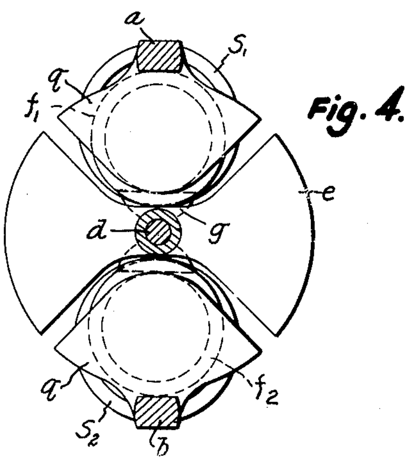
Fig. 4 is a vertical section taken on line 4—4 of Fig. 3.

The constructional example shown in Figs. 3, 4 shows a modified form of tuning condenser $K_1$, $K_2$ and tuning coil S, the latter also being divided into two halves $S_1$, $S_2$ each of which passes along the extended axis of one of the two rods *a* and *b*. In a similar manner, the inductance changing discs insulated from one another by bushings *g* and insertable between adjacent turns of tuning coil S are sectionalized into two sets $f_1$ and $f_2$ cooperative respectively with the coil sections $S_1$, $S_2$. As can be seen from Fig. 4 in this tuning system the fixed condenser plates *q* consist of quadrant-shaped sectors and the movable condenser plates *e* are in the form of two diametrically opposed quadrant-shaped sectors. In the form of the invention shown in these figures, the two halves $S_1$ and $S_2$ of the tuning coil are electrically connected in series by means of a conductive bridge piece *m* on which is located the mid-tap terminal *h*.

We claim:

1. A short wave tuning system comprising a stationary multi-turn inductance coil, disc members movable respectively between adjacent turns of said coil, said disc members being made of electrically conductive material and effective to vary the inductance of said coil upon movement thereof into and out of position between the coil turns, a variable condenser including a plurality of plates movable into position between a plurality of stationary plates, and means mounting said disc members and the movable plates of said condenser for simultaneous adjustment to simultaneously vary the inductance of said coil and the capacity of said condenser in the same sense.

2. A tuning system as defined in claim 1 wherein the mounting means for said disc members and movable condenser plates is comprised of a shaft of conductive material interconnecting said plates and said disc members are carried by insulating bushings on said shaft.

3. A tuning system as defined in claim 1 wherein the stationary plates of said condenser are comprised of two sets of substantially quadrant-shaped sectors arranged in parallel rows and the movable condenser plates are each comprised of diametrically opposed substantially quadrant-shaped sectors mounted for rotation on an axis located intermediate the two rows of stationary sectors.

4. A tuning system as defined in claim 1 wherein said coil is divided into two coil sections the turns of which are arranged in parallel rows, and said disc members are mounted for rotation on an axis located intermediate the two rows of coil turns.

5. A tuning system as defined in claim 1 wherein the stationary plates of said condenser and said tuning coil are respectively sectionalized into two sets of plates and two coil sections arranged in parallel rows, and said movable condenser plates and disc members are mounted at right angles to each other for rotation on an axis located intermediate the said rows of condenser plates and coil sections.

6. A tuning system as defined in claim 1 wherein said disc members are annular.

ALFRED KÄCH.
ALFRED DE QUERVAIN.

REFERENCES CITED

The following references are of record in the file of this patent:

UNITED STATES PATENTS

| Number | Name | Date |
|---|---|---|
| 2,341,345 | Van Billiard | Feb. 8, 1944 |
| 2,384,504 | Thias | Sept. 11, 1945 |

FOREIGN PATENTS

| Number | Country | Date |
|---|---|---|
| 309,894 | Germany | Dec. 21, 1918 |

OTHER REFERENCES

Proceedings of the I. R. E., vol. 31, No. 6, June 1943, pages 251 and 252.

Reprint of article by Summerhays: Converter Unit for G. E. F. M. Station in 250-40C.